(12) United States Patent
Suhler et al.

(10) Patent No.: US 10,878,859 B2
(45) Date of Patent: Dec. 29, 2020

(54) UTILIZING WRITE STREAM ATTRIBUTES IN STORAGE WRITE COMMANDS

(71) Applicant: Micron Technology, Inc., Boise, ID (US)

(72) Inventors: Paul A. Suhler, Austin, TX (US); Ram Krishan Kaul, Austin, TX (US); Michael B. Danielson, Georgetown, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/849,014

(22) Filed: Dec. 20, 2017

(65) Prior Publication Data

US 2019/0189167 A1  Jun. 20, 2019

(51) Int. Cl.
G11C 7/10       (2006.01)
G06F 12/0804    (2016.01)
G06F 3/06       (2006.01)

(52) U.S. Cl.
CPC ......... *G11C 7/1096* (2013.01); *G06F 3/0604* (2013.01); *G06F 3/0655* (2013.01); *G06F 12/0804* (2013.01); *G11C 7/1006* (2013.01)

(58) Field of Classification Search
CPC ............................ G11C 7/1096; G06F 3/0604
USPC ................................................... 365/189.16
See application file for complete search history.

(56) References Cited

U.S. PATENT DOCUMENTS

| | | | |
|---|---|---|---|
| 5,948,118 A * | 9/1999 | Higurashi | H03M 13/15 714/768 |
| 6,119,259 A | 9/2000 | Jeong | |
| 6,536,011 B1 | 3/2003 | Jang et al. | |
| 8,396,839 B1 * | 3/2013 | Huang | G06F 16/1748 707/664 |
| 9,128,820 B1 * | 9/2015 | Malina | G06F 16/1727 |
| 9,183,218 B1 * | 11/2015 | Wallace | G06F 16/1748 |
| 2002/0026564 A1 | 2/2002 | Kusakabe et al. | |
| 2006/0077883 A1 | 4/2006 | Ando et al. | |
| 2008/0294980 A1 | 11/2008 | Thienot et al. | |
| 2008/0303813 A1 | 12/2008 | Joung | |
| 2009/0012934 A1 | 1/2009 | Yerigan | |
| 2010/0199053 A1 | 8/2010 | Otani et al. | |
| 2013/0103891 A1 | 4/2013 | Sharon et al. | |

(Continued)

FOREIGN PATENT DOCUMENTS

KR    1020150020136 A    2/2015

OTHER PUBLICATIONS

Working Draft American National Standard, Project T10/BSR INCITS 506, Information technology—SCSI Block Commands—4 (SBC-4), 448 pages, Aug. 17, 2017.*

(Continued)

*Primary Examiner* — Muna A Techane
(74) *Attorney, Agent, or Firm* — Lowenstein Sandler LLP

(57) ABSTRACT

An example method of determining storage operation parameters based on data stream attributes may include: receiving, by a controller, a write command specifying a data item and an identifier of a data stream comprising the data item, wherein a part of the identifier of the data stream encodes a data attribute shared by data items comprised by the data stream; determining, using the data attribute, a storage operation parameter; and transmitting, to a memory device, an instruction specifying the data item and the storage operation parameter.

20 Claims, 8 Drawing Sheets

(56) References Cited

U.S. PATENT DOCUMENTS

| | | | |
|---|---|---|---|
| 2013/0159626 A1 | 6/2013 | Katz et al. | |
| 2014/0059406 A1 | 2/2014 | Hyun et al. | |
| 2014/0075240 A1* | 3/2014 | Maeda | G06F 11/2069 714/6.23 |
| 2016/0117266 A1 | 4/2016 | Anderson | |
| 2016/0147454 A1 | 5/2016 | Meir et al. | |
| 2016/0179386 A1* | 6/2016 | Zhang | G06F 3/0688 711/103 |
| 2017/0017411 A1 | 1/2017 | Choi et al. | |

OTHER PUBLICATIONS

JVM Express 1.3, NVM Express Revision 1.3, May 1, 2017, Apr. 26, 2017, 282 pages.*

NVM Express 1.3, NVM Express Revision 1.3, May 1, 2017, Apr. 26, 2017, 282 pages.

PCT Notification Of Transmittal Of The International Search Report And The Written Opinion Of The International Search Authority for PCT Application No. PCT/US2018/065813, dated Apr. 22, 2019, 13 pages.

PCT Notification of Transmittal Of The International Search Report And The Written Opinion Of The International Searching Authority for PCT Application No. PCT/US2018/065813, dated Apr. 22, 2019, 13 pages.

PCT Notification Of Transmittal Of The International Search Report And The Written Opinion Of The International Searching Authority, for the PCT Application No. PCT/US2019/024265, dated Jul. 11, 2019, 9 pages.

USPTO, Office Action for U.S. Appl. No. 15/937,146, dated Feb. 11, 2019.

USPTO, Final Office Action for U.S. Appl. No. 15/937,146, dated Jul. 1, 2019.

USPTO, Office Action for U.S. Appl. No. 15/937,146, dated Jan. 28, 2020.

USPTO, Advisory Action for U.S. Appl. No. 15/937,146, dated Oct. 9, 2019.

U.S. Appl. No. 15/937,146, filed Mar. 27, 2018.

PCT Notification Concerning Transmittal Of Copy Of International Preliminary Report On Patentability (Chapter I Of The Patent Cooperation Treaty) for PCT Application No. PCT/US2018/065813, dated Jul. 2, 2020, 8 pages.

\* cited by examiner

US 10,878,859 B2

UTILIZING WRITE STREAM ATTRIBUTES IN STORAGE WRITE COMMANDS

TECHNICAL FIELD

The present disclosure generally relates to storage devices, and more specifically, relates to specifying and utilizing write stream attributes in storage write commands.

BACKGROUND

A storage device, such as a solid-state drive (SSD), may include one or more non-volatile memory devices. The SSD may further include a controller that may manage allocation of data on the memory devices and provide an interface between the storage devices and the host computer system.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to specifying and utilizing write stream attributes in storage write commands that are transmitted by a host system to a storage device controller. The host system may group, into several data streams, the data to be written to the storage device, such that each data stream would contain data items belonging to the same group of associated data (e.g., the data associated with a single data structure, such as a file or a database). Thus, the data items contained by a single data stream may share one or more attributes reflecting anticipated media usage patterns, e.g., the anticipated retention time (also referred to as the "stream temperature") or the workload type. In certain implementations, the data stream may be identified by a dedicated field in each write command transmitted by the host system to the storage device controller. The storage device controller may utilize the stream identifying information in order to optimize the usage of the storage media (e.g., the negative-and (NAND) flash memory), e.g., by placing the data items of the same data stream in a contiguous section of the storage media.

In accordance with one or more aspects of the present disclosure, one or more bits of the stream identifier field of the write command may be utilized for specifying one or more data attributes shared by the data items of the data stream. Thus, each write command transmitted by the host system to the storage device controller may not only identify the stream, but also indicate the data attributes which are shared by the data items of the data stream. The storage device controller may utilize the stream identifying information enhanced by the data attributes in order to further optimize the usage of the storage media, e.g., by placing the data items of two or more data streams sharing one or more data attributes in the same or physically proximate sections of the storage media and/or avoiding the placement of two or more data streams having substantially different data attributes in the same or physically proximate sections of the storage media. Such placement strategies may be directed to distributing the programming and erasing cycles uniformly across the media in order to maximize the endurance of the storage media, as explained in more detail herein below.

Thus, aspects of the present disclosure represent significant improvements over various common implementations of storage devices and systems, by enhancing each write command with the data stream attributes in order to further optimize the usage of the storage media. Various aspects of the above referenced methods and systems are described in details herein below by way of examples, rather than by way of limitation.

Figure 1:
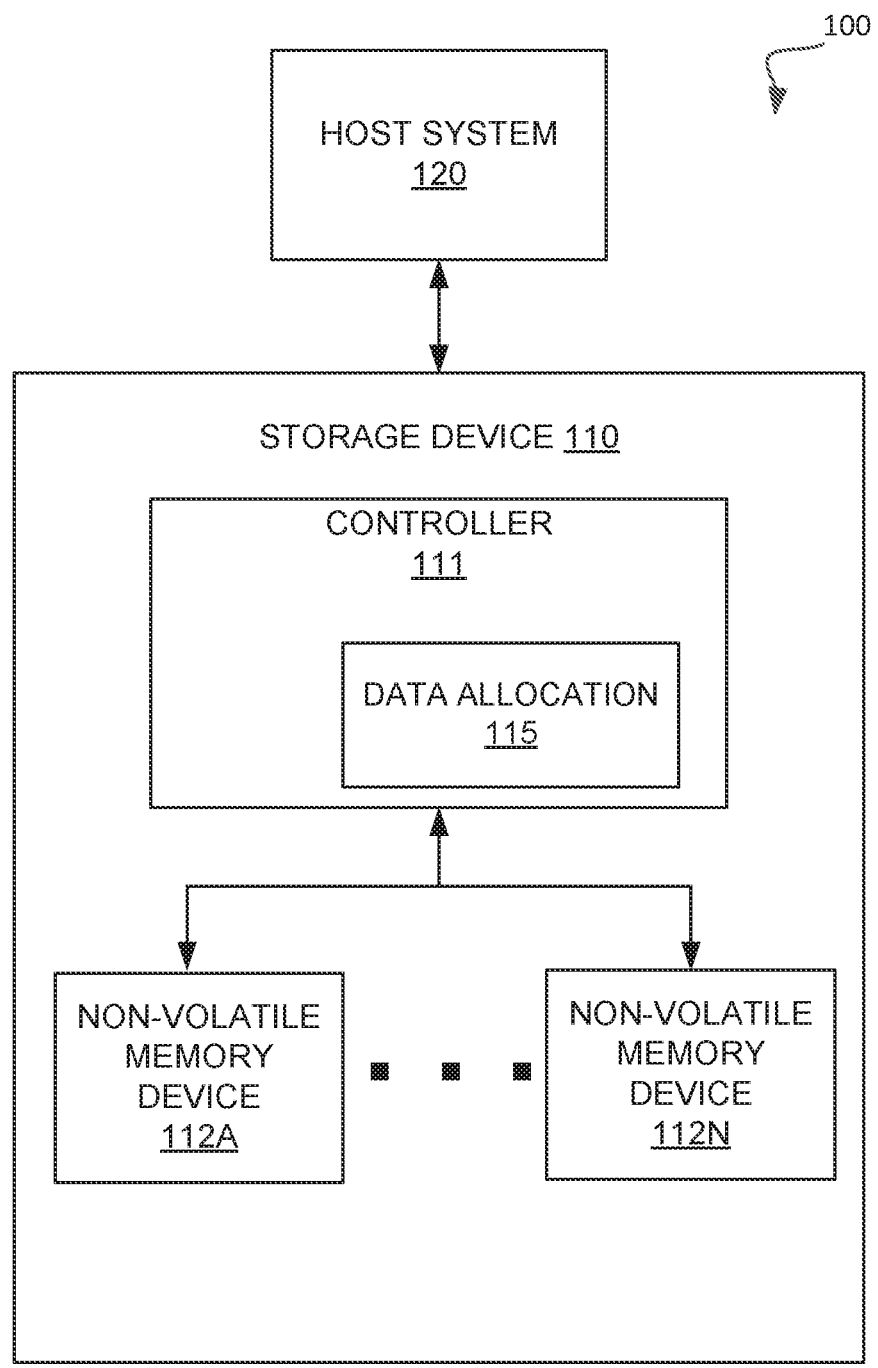
FIG. 1 schematically illustrates an example computing environment operating in accordance with one or more aspects of the present disclosure.

FIG. 1 schematically illustrates an example computing environment 100 operating in accordance with one or more aspects of the present disclosure. In general, the computing environment 100 may include a host system 120 that uses the storage device 110. For example, the host system 120 may write data to the storage device 110 and read data from the storage device 110. The host system 120 may be a computing device such as a desktop computer, laptop computer, network server, mobile device, or such computing device that includes a memory and a processing device. The host system 120 may include or be coupled to the storage device 110 so that the host system 120 may read data from or write data to the storage device 110. For example, the host system 120 may be coupled to the storage device 110 via a physical host interface. Examples of a physical host interface include, but are not limited to, a serial advanced technology attachment (SATA) interface, a peripheral component interconnect express (PCIe) interface, universal serial bus (USB) interface, an NVM Express (NVMe), Fibre Channel, Serial Attached SCSI (SAS), etc. The physical host interface may be used to transmit data between the host system 120 and the storage device 110. In an illustrative example, the host system 120 may be represented by the computer system 800 of FIG. 8.

As shown in FIG. 1, the storage device 110 may include a controller 111 and storage media, such as memory devices 112A to 112N. In certain implementations, the memory devices 112A to 112N may be provided by non-volatile memory devices, such as NAND flash memory. Each of the memory devices 112A to 112N may include one or more arrays of memory cells such as single level cells (SLCs), multi-level cells (MLCs), or quad-level cells (QLCs). Each of the memory cells may store bits of data (e.g., data blocks) used by the host system 120. Although non-volatile memory devices such as NAND flash memory are described, the memory devices 112A to 112N may be based on any other type of memory. For example, the memory devices 112A to 112N may be provided by random access memory (RAM), read-only memory (ROM), dynamic random access memory (DRAM), synchronous dynamic random access memory (SDRAM), phase change memory (PCM), magneto random access memory (MRAM), negative-or (NOR) flash memory, and electrically erasable programmable read-only memory (EEPROM). Furthermore, the memory cells of the memory devices 112A to 112N may be grouped as memory pages or data blocks that may refer to a unit of the memory device used to store data.

The controller 111 may communicate with the memory devices 112A to 112N to perform operations including reading data from or writing data to the memory devices 112A-112N. The controller 111 may include hardware such as one or more integrated circuits, firmware, or a combination thereof. In operation, the controller 111 may receive commands or operations from the host system 120 and may convert the commands or operations into instructions or appropriate commands to achieve the desired access to the memory devices 112A-112N. In various illustrative examples, the controller 111 may be responsible for other operations such as wear leveling, garbage collection, error detection and error-correcting code (ECC), encryption, caching, and address translations between a logical block address and a physical block address that are associated with the memory devices 112A-112N.

In order to implement the systems and methods of the present disclosure, the controller 111 may include a data allocation functional component 115 that may be employed to allocate the incoming data to particular locations on memory devices 112A-112N. It should be noted that the component designation is of a purely functional nature, i.e., the functions of the data allocation component may be implemented by one or more hardware components and/or firmware modules of the controller 111, as described in more detail herein below. The storage device 110 may include additional circuitry or components that are omitted from FIG. 1 for clarity and conciseness.

Figure 2:
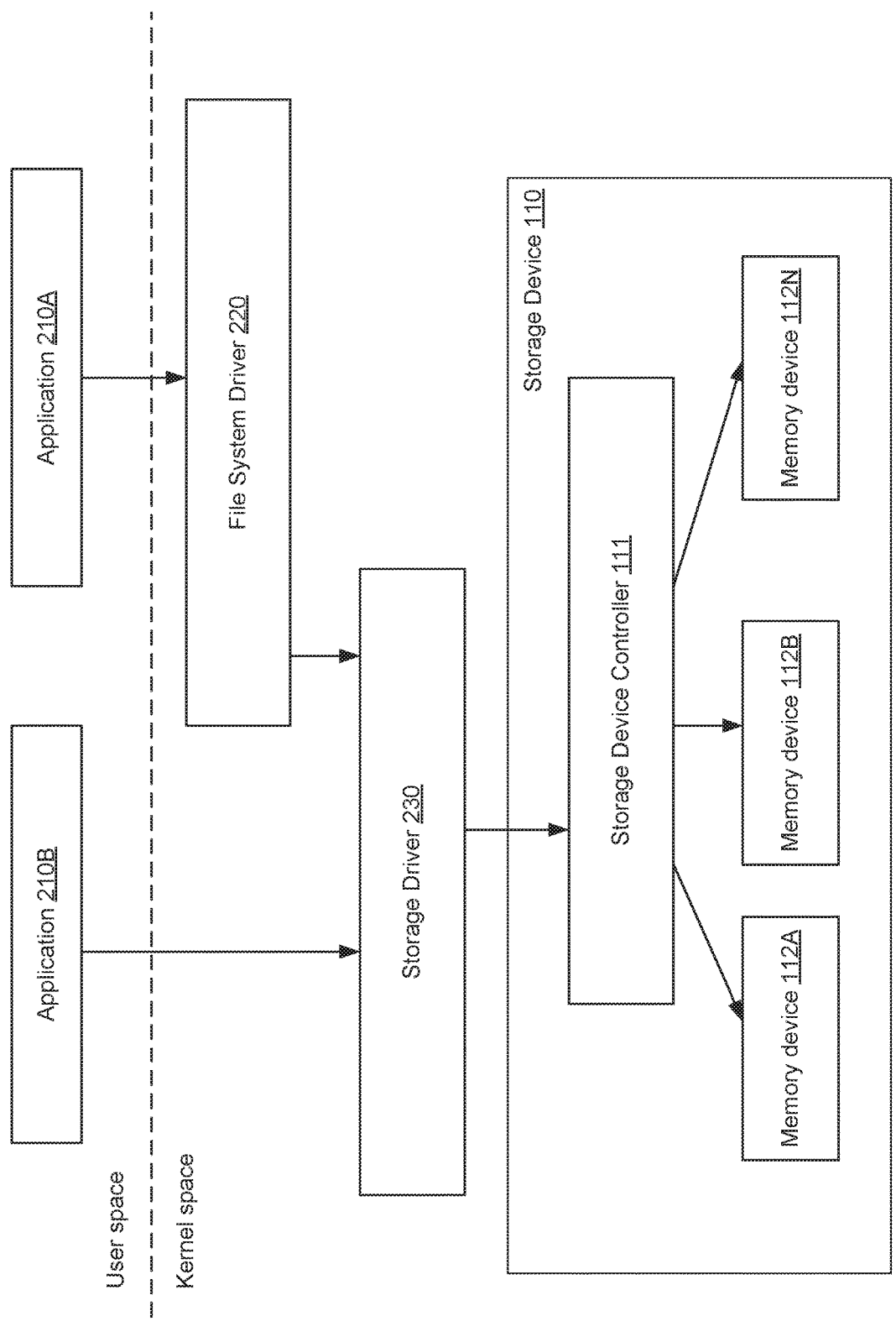
FIG. 2 schematically illustrates a programming model which may be implemented by the host system in communication with the storage device controller managing one or more storage devices, in accordance with one or more aspects of the present disclosure.

FIG. 2 schematically illustrates a programming model which may be implemented by the host system 120 in communication with the storage device controller 111 managing one or more memory devices 112A-112N, in accordance with one or more aspects of the present disclosure. As schematically illustrated by FIG. 2, the host system may execute one or more applications 210A-210B. In an illustrative example, the application 210A may be in communication with the file system driver 220, which may be running in the kernel space of the host system 120 and may be employed for processing certain system calls, such as read and write calls initiated by one or more applications 210, including the application 210A, running in the user space of the host system 120. The file system driver 220 may be employed to translate the read, write, and other system calls issued by the application 210A into low-level application programming interface (API) calls to the storage driver 230, which, in turn may communicate to the device controller 111 controlling one or more memory devices 112A-112N. The storage driver 230 may be running in the kernel mode of the host system and may be employed to process API calls issued by the file system driver 220 and/or system calls issued by the application 210B into storage interface commands to be processed by the storage the device controller 111 managing one or more memory devices 112A-112N.

In an illustrative example, the storage driver 230 may implement a block storage model, in which the data is grouped into blocks of one or more pre-defined sizes and is addressable by a block number. The block storage model may implement "read" and "write" command for storing and retrieving blocks of data. In an illustrative example, the storage driver 230 may implement a key-value storage model, in which the data is represented by the "value" component of a key-value pair is addressable by the "key" component of the key-value pair. The key value storage model may implement "put and get" commands, which are functionally similar to the "write" and "read" commands of the block storage model. Thus, the term "data item" as used herein may refer to a data block or to a key-value pair.

The application 210A-210B and/or the storage driver 230 executed by the host system 120 may group, into several data streams, the data to be written to the memory devices 112, such that the data items belonging to the same data stream would share one or more attributes. In an illustrative example, a data attribute may reflect the anticipated retention time of the data stream (also referred to as the "stream temperature"), such that a "hot" data stream would comprise short-living data items which are likely to be overwritten within a relatively short period of time (e.g., a period of time falling below a pre-defined low threshold), while a "cold" data stream comprise static data items which are not likely to be overwritten for a relatively long period of time (e.g., a period of time exceeding a pre-defined high threshold). In an illustrative example, the data stream temperature may be communicated to the storage driver 230 by the application 210 which produces the data stream and thus is presumably aware of its anticipated retention time. The data stream temperature may be communicated to the storage driver 230, e.g., via an Input/Output Control (IOCTL) system call. Alternatively, the data stream temperature may be determined by the storage driver 230, which may buffer the incoming data to be written to the memory devices 112A-112N, and may estimate the stream temperature based on the average frequency of overwrite operations requested by the application 210 with respect to one or more data items to be written to the memory devices 112A-112N. The storage driver 230 may then group the buffered data to be written to the storage device 110 into two or more data streams, and may issue stream write commands indicating the data stream temperature to the storage device controller 111, as described in more detail herein below.

In another illustrative example, a data attribute may reflect the workload type of the data stream, e.g., the "log data" attribute indicating that the data represents the logging data related to one or more databases and/or file systems or "user data" attribute indicating that the data represents other (not related to database or file system logs) types of data. The data stream workload type may be communicated to the storage driver 230 by the application 210 which produces the data stream and thus is presumably aware of its workload type. The data stream workload type may be communicated to the storage driver 230, e.g., via an Input/Output Control (IOCTL) system call. The storage driver may group the data labelled with the "log data" attribute into one or more data streams, and may issue stream write commands indicating the workload type to the storage device controller 111, as described in more detail herein below.

In certain implementations, the data stream may be identified by a dedicated field in each write command transmitted by the host system to the storage device controller. FIG.

Figure 3:
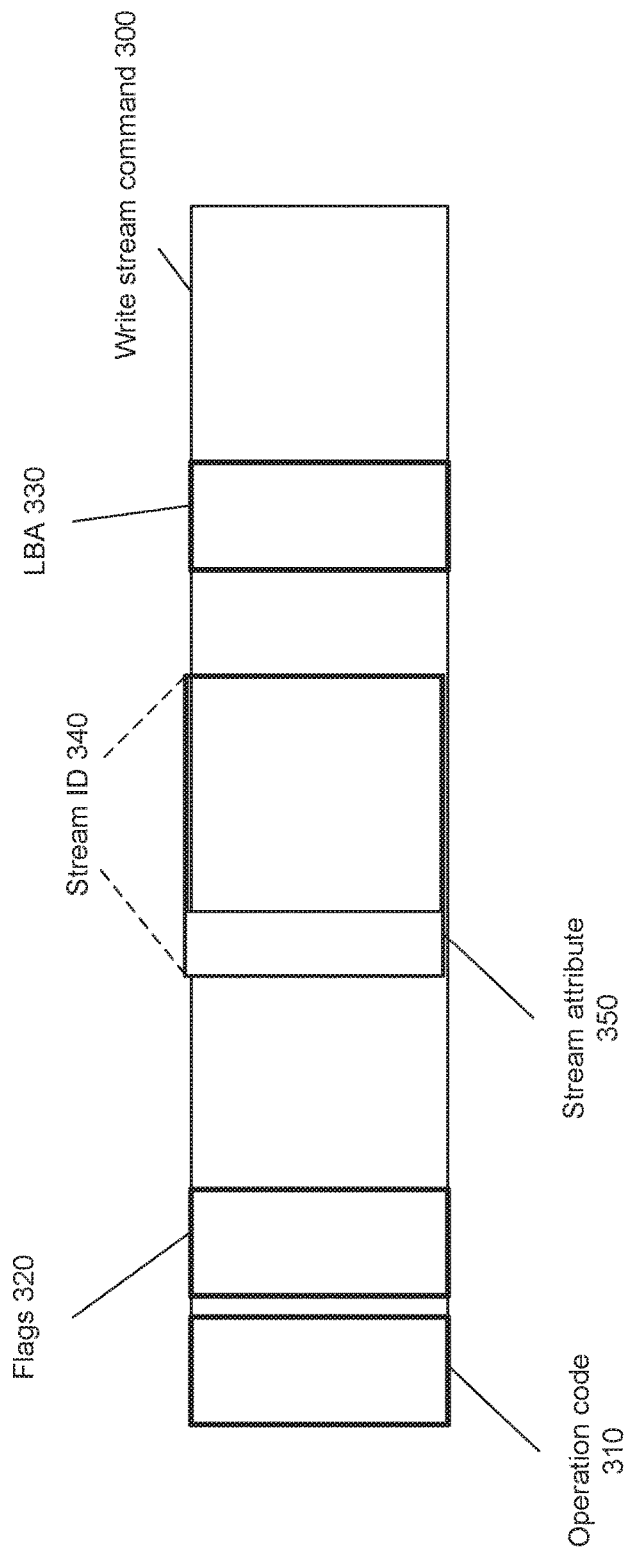
FIG. 3 schematically illustrates an example structure of the write stream command, in accordance with one or more aspects of the present disclosure.

3 schematically illustrates an example structure of the write stream command, in accordance with one or more aspects of the present disclosure. The write stream command 300 may include, among other fields, the operation code field 310 specifying the command type (e.g., the write stream command). The write stream command 300 may further include the flags field 320 specifying one or more parameters of the command. The write stream command 300 may further include the logical block address (LBA) field 330 specifying the LBA of the data being stored on the storage device. The write stream command 300 may further include the stream identifier field 340 represented by a bit string, which may be interpreted as an unsigned integer value. One or more bits (such as a group of one or more most significant bits or a group of or more least significant bits) of the stream identifier field 340 may be utilized for specifying one or more data stream attributes 350 shared by the data items of the data stream. In an illustrative example, one or more bits of the stream identifier field 340 may be utilized for specifying the data stream temperature (e.g., "0" indicating a cold stream and "1" indicating a hot stream, or "00" indicating unknown stream temperature, "01" indicating a cold stream, "10" indicating medium stream temperature, and "11" indicating a hot stream). In an illustrative example, one or more bits of the stream identifier field 340 may be utilized for specifying the workload type of the data stream (e.g., "1" indicating the "log data" workload type and "0" indicating "user data" workload type). The write stream command 300 may include various other fields which are omitted from FIG. 3 for clarity and conciseness.

Thus, each write command transmitted by the host system to the storage device controller may not only identify the stream, but also indicate the data attributes which are shared by the data items of the data stream. The storage device controller may utilize the stream identifying information enhanced by the data attributes in order to determine storage operation parameters (such as one or more parameters defining the data placement on the storage media) that would optimize the usage of the storage media. The storage device controller may implement one or more wear leveling methods directed to distributing the programming and erasing cycles uniformly across the media. The wear leveling methods implemented by the storage device controller may involve avoiding placing the "hot" data to the physical blocks that have experienced relatively heavy wear. The storage device controller may place the "cold" data and/or move the data that has not been modified for at least a certain period of time (e.g., a period of time exceeding a certain threshold) out of blocks that have experienced a low number of programming/erasing cycles into more heavily worn blocks. This strategy frees up the low-worn blocks for the "hot" data, while reducing the expected wear on the heavily-worn blocks.

In an illustrative example, erasing one or more data items of one data stream may require erasing one or more data items which are stored within the same or physically proximate sections of the storage media. Therefore, placing the data streams having substantially different expected retention time within the same or physically proximate sections of the storage media may result in excessive number of programming and erasing cycles to be performed by the controller on the storage media. Conversely, placing the data streams having similar expected retention time within the same or physically proximate sections of the storage media may result in reducing the number of programming and erasing cycles to be performed by the controller on the storage media. Accordingly, a storage device controller operating in one or more aspects of the present disclosure may implement a data placement strategy which is directed to distributing the programming and erasing cycles uniformly across the media in order to maximize the endurance of the storage media.

Figure 4:
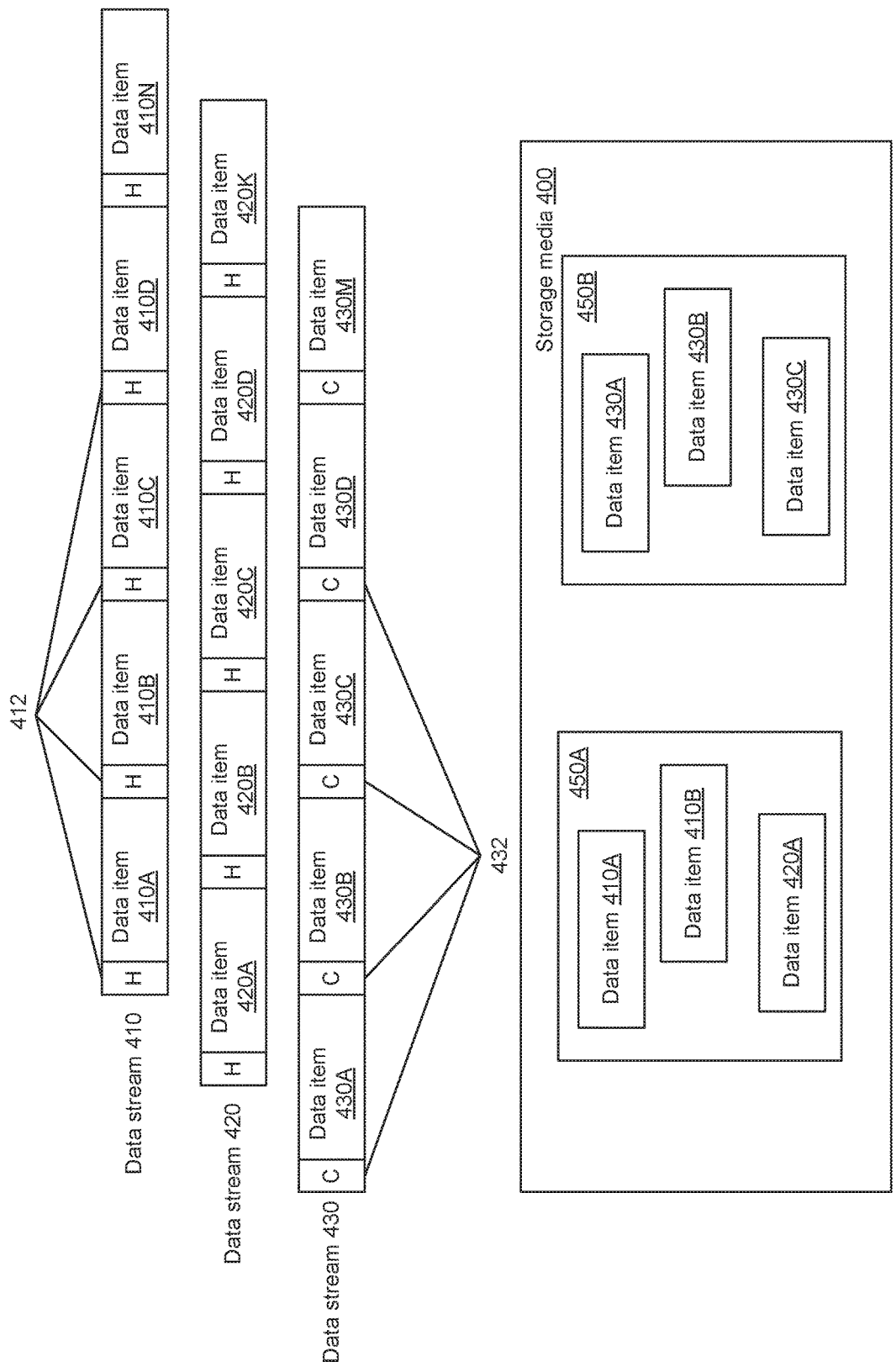
FIG. 4 schematically illustrates an example data placement strategy implemented by the storage device controller operating in accordance with one or more aspects of the present disclosure.

FIG. 4 schematically illustrates an example data placement strategy implemented by the storage device controller operating in accordance with one or more aspects of the present disclosure. In an illustrative example, the storage device controller may place the data items of two or more data streams sharing one or more data attributes (such as the data stream temperature and/or data stream workload type) in the same or physically proximate sections of the storage media. In an illustrative example, "section of the storage media" may be represented by a group of one or more memory cells such as single level cells (SLCs), multi-level cells (MLCs), or quad-level cells (QLCs) of NAND type flash memory. In another illustrative example, "section of the storage media" may be represented by groups of memory units addressable by the same signal (such as a word line or a bit line).

As shown in FIG. 4, data streams 410 and 420, including data items 410A-410N and 420A-420K, respectively, may share the stream temperature 412 (e.g., "H" denoting "hot"). Accordingly, the storage device controller may issue one or more device-level instructions to the data storage devices in order to place the data items of the data streams 410 and 420, including, for example, data items 410A, 410B, and 420A, into the same section 450A of the storage media 400.

In another illustrative example, the storage device controller may avoid placing two or more data streams having substantially different data attributes (such as the data stream temperature and/or data stream workload type) in the same or physically proximate sections of the storage media. As shown in FIG. 4, the data stream 430 including data items 430A-430M may have a stream temperature 432 (e.g., "C" denoting "cold") which is different from the stream temperature 412 shared by the data streams 410 and 420. Accordingly, the storage device controller may issue one or more device-level instructions to the data storage devices in order to place the data items of the data stream 430, including, for example, data items 430A, 430B, and 430C, into the section 450B of the storage media 400.

Figure 5:
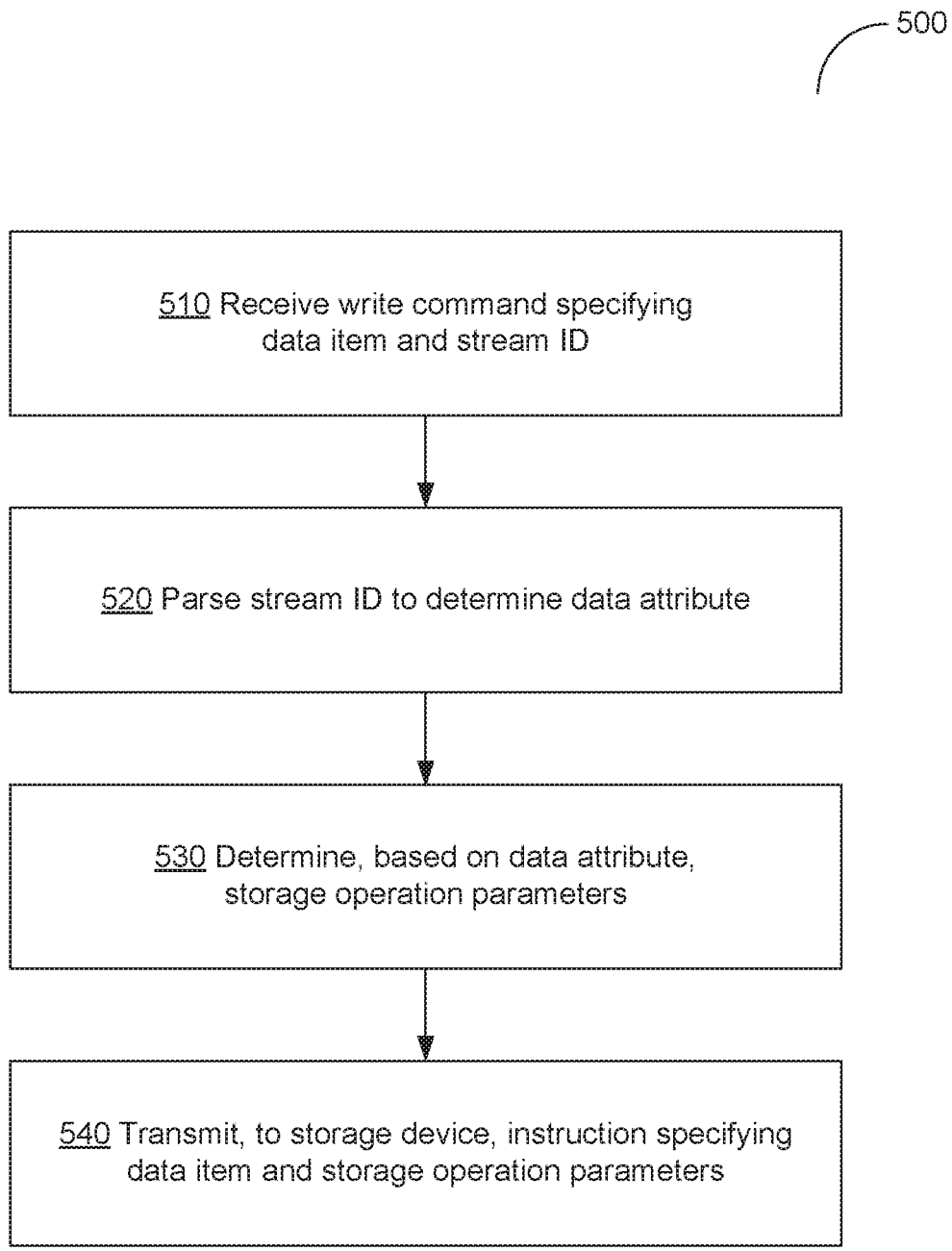
FIG. 5 is a flow diagram of an example method 500 of determining storage operation parameters based on data stream attributes, in accordance with one or more aspects of the present disclosure.

FIG. 5 is a flow diagram of an example method 500 of determining storage operation parameters based on data stream attributes, in accordance with one or more aspects of the present disclosure. The method 500 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 may be performed by the storage device controller 111 of FIG. 1.

As shown in FIG. 5, at block 510, the processing logic implementing the method may receive, from a host system, a write command specifying a data item to be written to a memory device managed by the storage device controller. The write command may further specify an identifier of a data stream to which the write command belongs. In an illustrative example, the identifier of the data stream is provided by an unsigned integer value. A portion of the identifier of the data stream may encode one or more data attributes shared by the data items of the data stream. In an illustrative example, the data attribute may include a value reflecting an anticipated retention time of the data items of the data stream. In another illustrative example, the data attribute may include a value reflecting a workload type of the data items of the data stream, as described in more detail herein above.

At block 520, the processing logic may parse the identifier of the data stream to determine a data attribute shared by data items comprised by the data stream. In an illustrative example, parsing the identifier of the data stream may involve identifying a bit string of a pre-defined size starting from a pre-defined position within the data stream identifier.

At block 530, the processing logic may determine, based on the data attribute, one or more storage operation parameters (such as one or more parameters defining the data placement on the storage media) that would optimize the usage of the storage media, e.g., by uniformly distributing programming cycles across the storage media. In an illustrative example, a storage operation parameter may identify the section of the memory device to be utilized for storing the data item. In another illustrative example, the identified section may be located in a physical proximity of another section, which is used for storing another data stream having the same attribute as the data items being stored, as described in more detail herein above.

At block 540, the processing logic may transmit, to the storage device, an instruction specifying the data item and the storage operation parameters, as described in more detail herein above.

Figure 6:
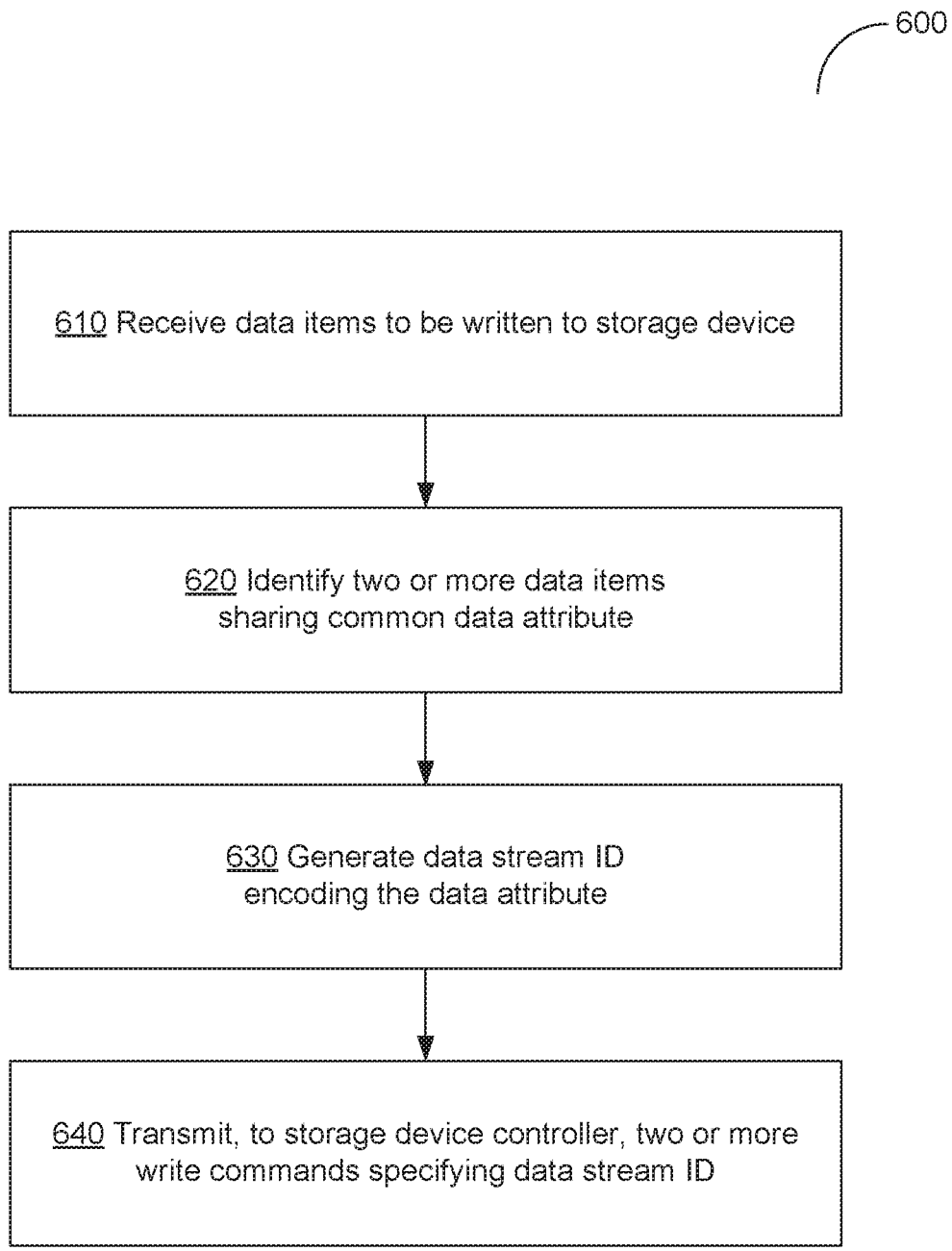
FIG. 6 is a flow diagram of an example method 600 of providing data stream attributes within the data stream identifier field of stream write commands, in accordance with one or more aspects of the present disclosure.

FIG. 6 is a flow diagram of an example method 600 of providing data stream attributes within the data stream identifier field of stream write commands, in accordance with one or more aspects of the present disclosure. The method 600 may be performed by processing logic that may include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 may be performed by the host system 120 of FIG. 1 (e.g., by the storage driver 230 of FIG. 2).

As shown in FIG. 6, at block 610, the processing logic implementing the method may receive a plurality of data items to be written to a storage device. The plurality of data items may be produced by an application running on the host system, as described in more detail herein above with references to FIG. 2.

At block 620, the processing logic may group the received data items into one or more data streams, such that the data items contained by a single data stream may share one or more attributes reflecting anticipated media usage patterns, e.g., the anticipated retention time (also referred to as the "stream temperature") or the workload type. In an illustrative example, the processing logic may identify, among the plurality of data items, two or more data items sharing one or more data attributes. Based on the data attribute values, the processing logic may append the identified data items to a newly created or an existing data stream. In an illustrative example, the data attribute may include a value reflecting an anticipated retention time of the data items of the data stream. In another illustrative example, the data attribute may include a value reflecting a workload type of the data items of the data stream, as described in more detail herein above.

At block 630, the processing logic may generate a data stream identifier which includes an encoded form of the data attribute. In an illustrative example, the data stream identifier may be provided by an unsigned integer value, one or more bits of which may be utilized for encoding the data attributes shared by the data items of the data stream. In an illustrative example, the bit string encoding the data attributes may have a pre-defined size and may start from a pre-defined position within the data stream identifier. In an illustrative example, the data attribute may include a value reflecting an anticipated retention time of the data items of the data stream. In another illustrative example, the data attribute may include a value reflecting a workload type of the data items of the data stream, as described in more detail herein above.

At block 640, the processing logic may transmit, to a controller of the storage device, one or more write commands specifying the data comprised by the first data item and the second data item. Each write command may further specify the data stream identifier, the reserved part of which encodes the data attribute.

Figure 7:
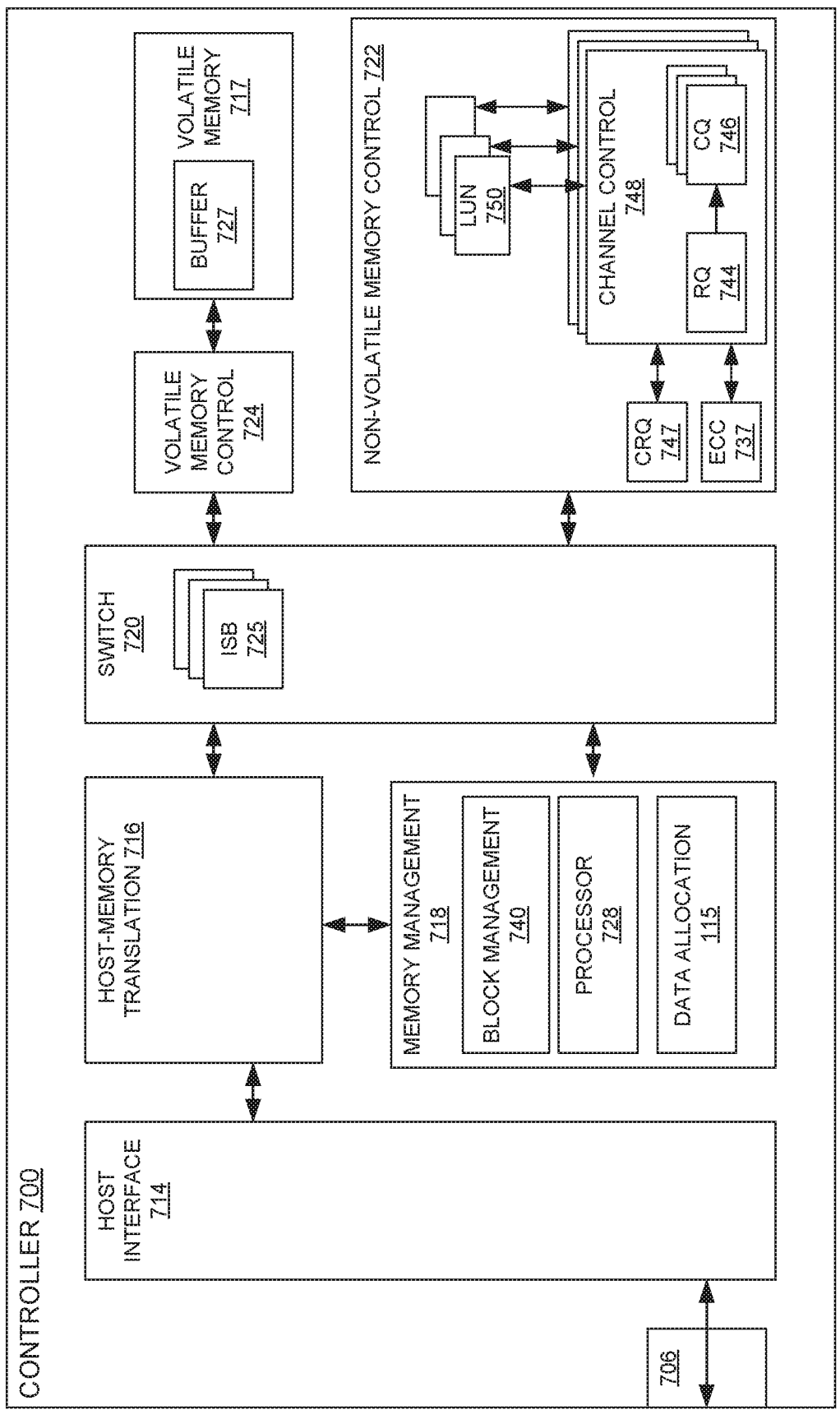
FIG. 7 is a block diagram of an example storage device controller operating in accordance with one or more aspects of the present disclosure.

FIG. 7 is a block diagram of an example storage device controller 700, which may implement the functionality of the controller 111 of FIG. 1. As shown in FIG. 7, the controller 700 may include a host interface circuitry 714 to interface with a host system via a physical host interface 706. The host interface circuitry 714 may be employed for converting commands received from the host system into device-level instructions. The host interface circuitry 714 may be in communication with the host-memory translation circuitry 716, which may be employed for translating host addresses to memory device addresses. For example, the host-memory translation circuitry 716 may convert logical block addresses (LBAs) specified by host system read or write operations to commands directed to non-volatile memory units identified by logical unit numbers (LUNs) 750. The host-memory translation circuitry 716 may include error detection/correction circuitry, such as exclusive or (XOR) circuitry that may calculate parity information based on information received from the host interface circuitry 714.

The memory management circuitry 718 may be coupled to the host-memory translation circuitry 716 and the switch 720. The memory management circuitry 718 may control various memory management operations including, but not limited to, initialization, wear leveling, garbage collection, reclamation, and/or error detection/correction. The memory management circuitry 718 may include block management circuitry 740 which may be employed for retrieving data from the volatile memory 717 and/or non-volatile memory identified by LUNs 750. For example, the block management circuitry 740 may retrieve information such as identifications of valid data blocks, erase counts, and/or other status information of the LUNs 750. The memory management circuitry 718 may further include data allocation component 115 that may be employed to allocate the incoming data to particular locations on logical units identified by LUNs 750. It should be noted that the component designation is of a purely functional nature, i.e., the functions of the data allocation component may be implemented by one or more hardware components and/or firmware modules of the controller 700, such as the processor 728, which may be employed for implementing at least some of the above-referenced memory management operations.

The switch 720 may be coupled to the host-memory translation circuitry 716, the memory management circuitry 718, the non-volatile memory control circuitry 722, and/or the volatile memory control circuitry 724. The switch 720 may include and/or be coupled to a number of buffers. For example, the switch 720 may include internal static random access memory (SRAM) buffers (ISBs) 725. The switch may be coupled to DRAM buffers 727 that are included in the volatile memory 717. In some embodiments, the switch 720 may provide an interface between various components of the controller 700.

The non-volatile memory control circuitry 722 may store, in one of the buffers (e.g., the ISBs 725 or the buffer 727), information corresponding to a received read command. Furthermore, the non-volatile memory control circuitry 722 may retrieve the information from one of the buffers and write the information to a logical unit of the non-volatile memory identified by a LUN 750. The logical units identified by LUNs 750 may be coupled to the non-volatile memory control circuitry 722 by a number of channels. In some embodiments, the number of channels may be controlled collectively by the non-volatile memory control circuitry 722. In some embodiments, each memory channel may be coupled to a discrete channel control circuit 748. A particular channel control circuit 748 may control and be coupled to more than one memory unit 750 by a single channel.

The non-volatile memory control circuitry 722 may include a channel request queue (CRQ) 747 that is coupled to each of the channel control circuits 748. Furthermore, each channel control circuit 748 may include a memory unit request queue (RQ) 744 that is coupled to multiple memory unit command queues (CQs) 746. The CRQ 747 may be configured to store commands (e.g., write requests or read requests) shared between channels, the RQ 744 may be configured to store commands between the memory units 750 on a particular channel, and the CQ 746 may be configured to queue a current command and a next command to be executed subsequent to the current command.

The CRQ 747 may be configured to receive a command from the switch 720 and relay the command to one of the RQs 744 (e.g., the RQ 744 associated with the channel that is associated with the particular logical unit identified by the LUN 750 for which the command is targeted). The RQ 744 may be configured to relay a first number of commands for a particular memory unit 750 to the CQ 746 that is associated with the particular logical unit identified by the LUN 750 in an order that the first number of commands were received by the RQ 744. A command pipeline may be structured such that commands to the logical unit move in a particular order (e.g., in the order that they were received by the RQ 744). The RQ 744 may be configured to queue a command for a particular logical unit in response to the CQ 746 associated with the particular logical unit being full and the CRQ 747 may be configured to queue a command for a particular RQ 744 in response to the particular RQ 744 being full.

The RQ 744 may relay a number of commands for different logical units identified by LUNs 750 to the CQs 746 that are associated with the logical units in an order according to the status of the logical units. For example, the logical unit status may be a ready/busy status. The command pipeline is structured such that the commands between different logical units may move out of order (e.g., in an order that is different from the order in which they were received by the RQ 744 according to what is efficient for overall memory operation at the time). For example, the RQ 744 may be configured to relay a first one of the second number of commands to a first CQ 746 before relaying a second command from the second number of commands to a second CQ 746 in response to the status of the different logical unit associated with the second CQ 746 being busy, where the first command is received later in time than the second command. The RQ 744 may be configured to relay the second command to the second CQ 746 in response to the status of the logical unit associated with the second CQ 746 being ready (e.g., subsequent to relaying the first command).

In some embodiments, the control circuits for each channel may include discrete error detection/correction circuitry 737 (e.g., error correction code (ECC) circuitry), coupled to each channel control circuit 748 and/or a number of error detection/correction circuits 737 that can be used with more than one channel. The error detection/correction circuitry 737 may be configured to apply error correction such as Bose-Chaudhuri-Hocquenghem (BCH) error correction to detect and/or correct errors associated with information stored in the logical unit identified by the LUN 750. The error detection/correction circuitry 737 may be configured to provide differing error correction schemes for SLC, MLC, or QLC operations.

Figure 8:
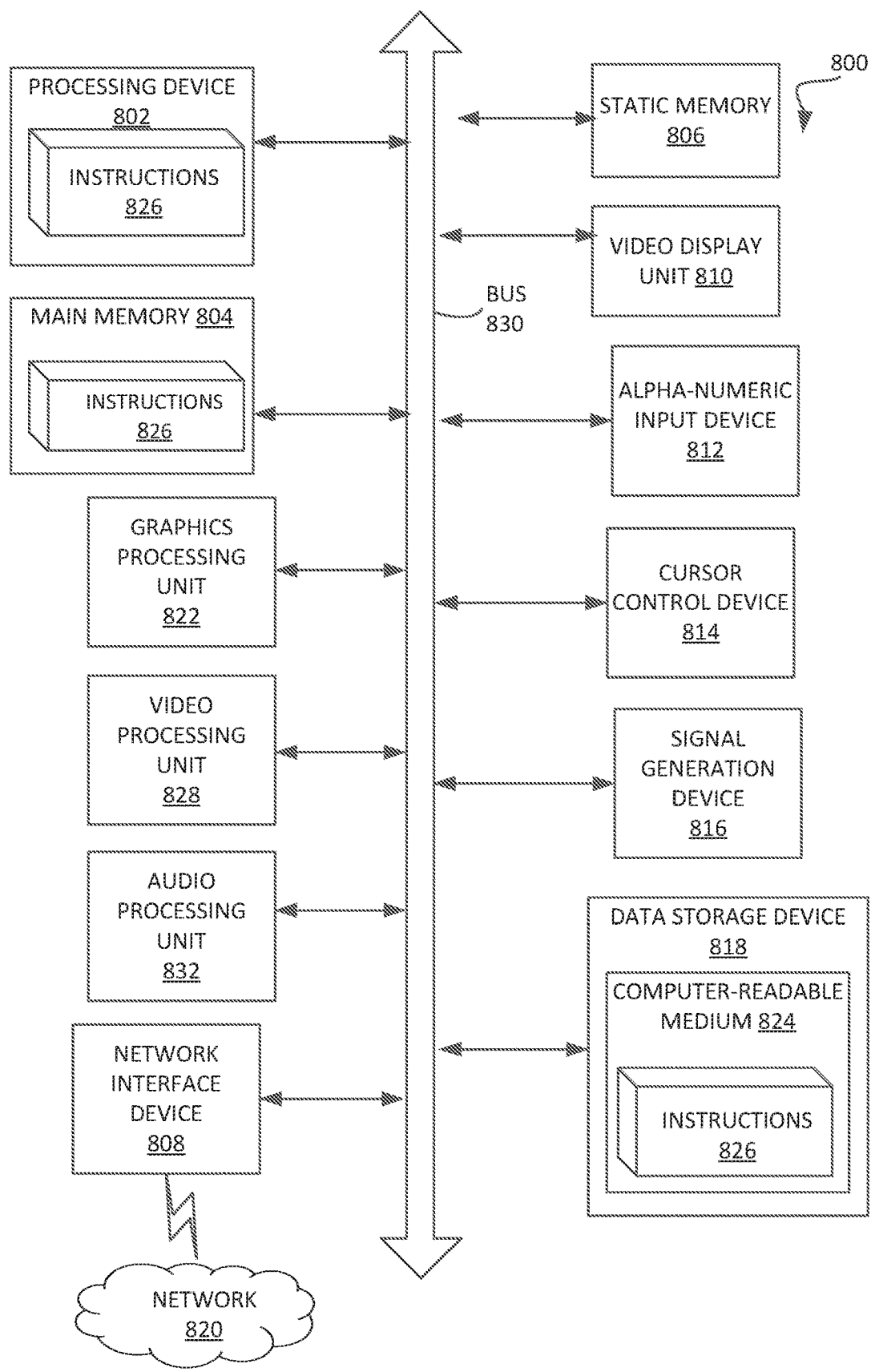
FIG. 8 schematically illustrates a block diagram of an example computer system in which implementations of the present disclosure may operate.

FIG. 8 illustrates an example computer system 800 within which a set of instructions, for causing the computer system to perform any one or more of the methodologies discussed herein, may be executed. In an illustrative example, the computer system 800 may implement the functions of the host system 120 of FIG. 1. In alternative implementations, the computer system may be connected (e.g., networked) to other computer systems in a LAN, an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a Personal Digital Assistant (PDA), a cellular telephone, a web appliance, a server, a network router, a switch or bridge, or any computer system capable of executing a set of instructions (sequential or otherwise) that specify actions to be taken by that computer system. Further, while a single computer system is illustrated, the term "computer system" shall also be taken to include any collection of computer system s that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM)), a static memory 806 (e.g., flash memory, static random access memory (SRAM), etc.), and a data storage device 818, which communicate with each other via a bus 830. In an illustrative example, the data storage device 818 may implement the functions of the storage device 110 of FIG. 1.

Processing device 802 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include computer-readable storage medium 824 on which is stored one or more sets of instructions or software 826 embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting computer-readable storage media. The computer-readable storage medium 824, data storage device 818, and/or main memory 804 may correspond to the storage device 110 of FIG. 1.

In one implementation, the instructions 826 include instructions to implement functionality corresponding to a data allocation component (e.g., data allocation component 115 of FIG. 1). While the computer-readable storage medium 824 is shown in an example implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the computer and that cause the computer to perform any one or more of the methodologies of the present disclosure. The term "computer-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving" or "determining" or "transmitting" or "reflecting" or "specifying" or "identifying" or "providing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a computer-readable medium having stored thereon instructions, which may be used to program a computer system (or other electronic devices) to perform a process according to the present disclosure. A computer-readable medium includes any mechanism for storing information in a form readable by a machine (e.g., a computer system). For example, a computer-readable (e.g., computer-readable) medium includes a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A method, comprising:
    receiving, by a controller, a write command, wherein the write command specifies a data item and an identifier of a data stream, wherein the data stream comprises the data item;
    determining, by parsing the identifier of the data stream, a data attribute shared by data items comprised by the data stream, wherein the data attribute is encoded by a bit string of a pre-defined size starting from a pre-defined position within the identifier of the data stream;
    determining, using the data attribute, a storage operation parameter; and
    transmitting, to a memory device, an instruction specifying the data item and the storage operation parameter.

2. The method of claim 1, wherein the storage operation parameter identifies a section of the memory device to be utilized for storing the data item.

3. The method of claim 1, wherein the data attribute comprises a value reflecting a retention time of the data items.

4. The method of claim 1, wherein the data attribute specifies a workload type of the data items.

5. The method of claim 1, wherein determining the storage operation parameter comprises:
identifying a section of the memory device to be utilized for storing the data item, in order to uniformly distribute programming cycles across storage media of the memory device.

6. The method of claim 1, wherein determining the storage operation parameter comprises:
identifying a first section of the memory device to be utilized for storing the data item in a physical proximity of a second section of the memory device, wherein the second section stores one or more data items of a second data stream characterized by the data attribute.

7. The method of claim 1, wherein the storage operation parameter optimizes usage of storage media by uniformly distributing programming cycles across the storage media.

8. The method of claim 1, wherein the data attribute specifies a media usage patterns by the data items comprised by the data stream.

9. The method of claim 1, wherein determining the storage operation parameter further comprises:
identifying a first section of the memory device to be utilized for storing the data item, such that the first section is located in a physical proximity of a second section of the memory device, wherein the second section is used for storing one or more data items of another data stream having the data attribute shared by the data items comprised by the data stream.

10. A system, comprising:
a memory device;
a controller operatively coupled to the memory devices, the controller to;
receive a write command, wherein the write command specifies a data item and an identifier of a data stream, wherein the data stream comprises the data item;
determine, by parsing the identifier of the data stream, a data attribute shared by data items comprised by the data stream, wherein the data attribute is encoded by a bit string of a pre-defined size starting from a pre-defined position within the identifier of the data stream;
determine, using the data attribute, a storage operation parameter; and
transmit, to a memory device, an instruction specifying the data item and the storage operation parameter.

11. The system of claim 10, wherein the storage operation parameter identifies a section of the memory device to be utilized for storing the data item.

12. The system of claim 10, wherein the data attribute comprises a value reflecting a retention time of the data items.

13. The system of claim 10, wherein the data attribute specifies a workload type of the data items.

14. The system of claim 10, wherein determining the storage operation parameter comprises:
identifying a section of the memory device to be utilized for storing the data item, in order to uniformly distribute programming cycles across storage media of the memory device.

15. The system of claim 10, wherein determining the storage operation parameter comprises:
identifying a section of the memory device to be utilized for storing the data item in a physical proximity of a second section of the memory device, wherein the second section stores one or more data items of a second data stream characterized by the data attribute.

16. A non-transitory computer-readable storage medium storing executable instructions which, when executed by a storage device controller, cause the storage device controller to:
receive a write command, wherein the write command specifies a data item and an identifier of a data stream, wherein the data stream comprises the data item;
determine, by parsing the identifier of the data stream, a data attribute shared by data items comprised by the data stream, wherein the data attribute is encoded by a bit string of a pre-defined size starting from a pre-defined position within the identifier of the data stream;
determine, using the data attribute, a storage operation parameter; and
transmit, to a memory device, an instruction specifying the data item and the storage operation parameter.

17. The non-transitory computer-readable storage medium of claim 16, wherein the storage operation parameter identifies a section of the memory device to be utilized for storing the data item.

18. The non-transitory computer-readable storage medium of claim 16, wherein the data attribute comprises a value reflecting a retention time of the data items.

19. The non-transitory computer-readable storage medium of claim 16, wherein the data attribute specifies a workload type of the data items.

20. The non-transitory computer-readable storage medium of claim 16, wherein determining the storage operation parameter comprises:
identifying a section of the memory device to be utilized for storing the data item, in order to uniformly distribute programming cycles across storage media of the memory device.

* * * * *